United States Patent [19]
Nozu et al.

[11] Patent Number: 5,332,912
[45] Date of Patent: Jul. 26, 1994

[54] HETEROJUNCTION BIPOLAR TRANSISTOR

[75] Inventors: Tetsuro Nozu, Tokyo; Norio Iizuka, Yokohama; Junko Akagi, Kawasaki; Torakiti Kobayashi, Yokohama; Masao Obara, Tokyo, all of Japan

[73] Assignee: Kabushiki Kaisha Toshiba, Kawasaki, Japan

[21] Appl. No.: 51,617

[22] Filed: Apr. 23, 1993

[30] Foreign Application Priority Data

Apr. 24, 1992 [JP]  Japan .................................. 4-106763

[51] Int. Cl.$^5$ ............................................. H01L 29/61
[52] U.S. Cl. ................................ 257/197; 257/510; 257/515; 257/517; 257/571; 257/619; 257/623; 257/523
[58] Field of Search ............... 257/197, 510, 515, 517, 257/571, 619, 623, 523

[56] References Cited

U.S. PATENT DOCUMENTS 3,700,978 10/1972 North et al. ...................... 257/523
4,683,487 7/1987 Ueyanagi et al. .................. 257/523

OTHER PUBLICATIONS

IEEE Electron Devices Letters, vol. EDL-8, No. 7; M. F. Chang, et al.; Jul. 1987; pp. 303–305.

*Primary Examiner*—Edward Wojciechowicz
*Attorney, Agent, or Firm*—Oblon, Spivak, McClelland, Maier & Neustadt

[57] ABSTRACT

A heterojunction bipolar transistor comprises n$^+$-type GaAs collector contact region, an n-type GaAs collector region, a p$^+$-type GaAs base region, an n-type AlGaAs emitter region, and an n$^+$-type InGaAs emitter contact region, all of which are formed on a semiinsulative GaAs substrate. A heterojunction is formed by the base region and the emitter region. The emitter region is formed in mesa shape by dry etching. Around this mesa, B$^+$ ion-implanted high-resistance region is formed. The base-emitter junction is isolated from the ion-implanted region. The heterojunction bipolar transistor therefore has little on-voltage changes.

16 Claims, 6 Drawing Sheets

HETEROJUNCTION BIPOLAR TRANSISTOR

BACKGROUND OF THE INVENTION

1. Field of the Invention

The present invention relates to a heterojunction bipolar transistor, and particularly to a heterojunction bipolar transistor having device size defined by ion implantation.

2. Description of the Related Art

With the progress of industries in these days, there are continuously increasing demands for a computer of the ultra high and ultra large type, for a communication system of large capacity, and for a vehicular communication system of high frequency range. As an ultra high speed device suitable for such usages, heterojunction bipolar transistors formed of compound semiconductors, such as GaAs and InP are drawing attention and have been developed actively at present.

In order to allow these transistors to operate in a high speed, it is necessary to reduce parasitic capacitances, and thus to minimize the element sizes of the device, especially emitter size. A method utilizing an ion implantation is known as a method for minimizing and defining the emitter size. This method is to implant ions, such as $B^+$, $H^+$, and $O^+$, into an area from the outside of a mesa to a marginal portion of a semiconductor layer for forming the emitter region in the mesa. By virtue of this, the marginal portion of the semiconductor layer, and a marginal portion of a semiconductor layer for forming a base region are changed to have high resistances, whereby the emitter length is defined in the direction of leading an emitter electrode.

Figure 1A:
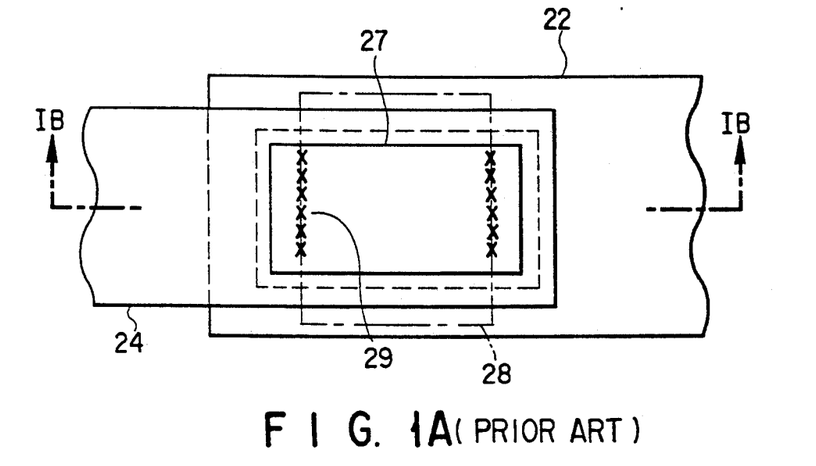
FIG. 1A is a plan view showing a conventional heterojunction bipolar transistor.
Figure 1B:
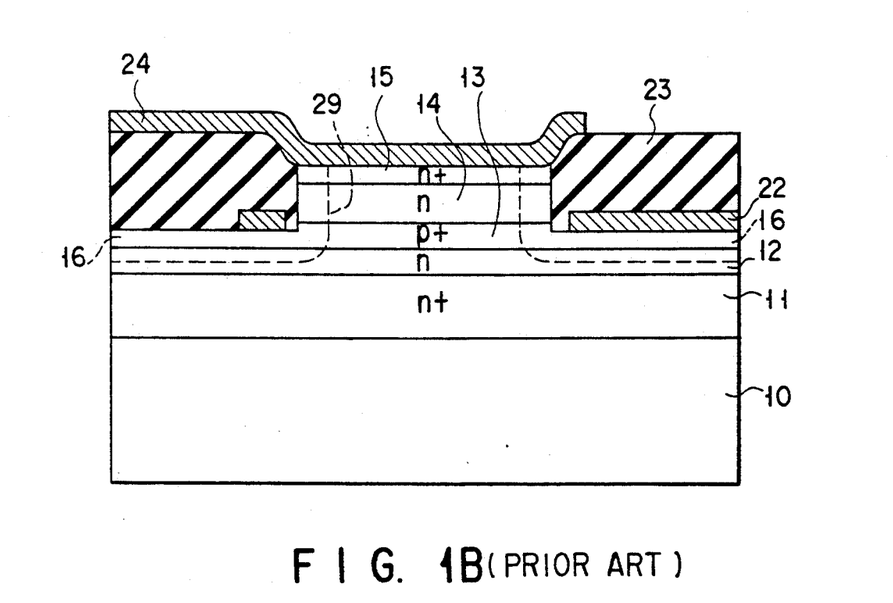
FIG. 1B is a cross sectional view along line IB—IB in FIG. 1A.

FIG. 1A shows a plan view of a conventional heterojunction bipolar transistor in which emitter size is reduced by ion implantation. FIG. 1B shows a cross sectional view along line IB—IB in FIG. 1A. In FIGS. 1A and 1B, reference symbol 10 denotes an i-type (intrinsic semiconductor, semiinsulative) substrate; 11, an $n^+$-type collector contact layer; 12, an n-type collector layer; 13, a $p^+$-type base layer; 14, an n-type emitter layer; 15, an $n^+$-emitter contact; 16, a high resistant region implanted with $B^+$ ions; 22, a base electrode; 23, an insulating layer; and 24, an emitter electrode. In this structure, part of the interface 28 of the ion implanted region 16 is located inside a mesa 27, so that part of the emitter layer 14 is changed to have a high resistance, whereby the emitter length is defined in the direction of leading an emitter electrode.

In the case of defining emitter length by well known wet etching methods, an isotropic wet etching is apt to reduce pattern accuracy of the emitter mesa, while an anisotropic wet etching is apt to form reverse taper on the sides of the emitter mesa thereby cutting off interconnections for leading an electrode. Therefore, the above described method for defining the emitter length by ion implantation as shown in FIGS. 1A and 1B was considered to be an advantageous technique for manufacturing a high speed device.

However, recently, it has been found that this method has a substantial defect in the reliability of the resultant device. As a result of experiments of accelerative degradation under high temperature and electric current flowing conditions conducted by the inventors, it has been found that a device having a emitter length defined by ion implantation is apt to increase its on-voltage (base-emitter voltage when a predetermined collector current starts to flow), and thus degrade its characteristics. This is attributed to base impurities, such as Be, C, Zn, Mg, Si, or Sn, being abnormally diffused into the emitter region which differs in band gap energy from the base region (Reference material; Shigaku Giho Vol. 91, No. 423, ED91-163, MW91-146, ICD91-189).

As mentioned above, when emitter size is defined by wet etching method, reduction of the accuracy of pattern and cutting of interconnections for leading electrode are caused and device reliability is reduced. Also, when the emitter size is defined by ion implantation, there is a problem of on-voltage changes.

SUMMARY OF THE INVENTION

An object of the present invention is to provide a heterojunction bipolar transistor which has less on-voltage changes and high reliability.

The outline of the invention is to use ion implantation to define device size, and to use dry etching to define emitter size (or collector size). An ion implanted region is not allowed to contact the junction between an emitter region (or collector region) and a base region.

According to a first aspect of the present invention, there is provided a heterojunction bipolar transistor comprising:

a semiconductor support layer;

a collector region of a first conductivity type, formed of a low-resistance part of a first semiconductor film formed on the support layer;

a first high-resistance region, formed of a high-resistance part of the first semiconductor film surrounding and defining the collector region, the first high-resistance region containing ion-implanted impurities for attaining a high-resistance;

a collector electrode contacting the collector region;

a base region of a second conductivity type, formed of a low-resistance part of a second semiconductor film formed on the collector region, and located substantially within plan view area of the collector region defined by the first high-resistance region;

a second high-resistance region, formed of a high-resistance part of the second semiconductor film surrounding and defining the base region, the second high-resistance region containing ion-implanted impurities for attaining a high-resistance;

a base electrode contacting the base region;

an emitter region of the first conductivity type, formed of a third semiconductor film formed on the base region, the emitter region forming a heterojunction along with the base region, the emitter region is formed as emitter mesa on the base region by dry etching and also located substantially within plan view area of the collector and base regions defined by the first and second high-resistance regions, respectively;

an insulating film surrounding and defining the emitter region, the insulating film being formed independently of the third semiconductor film; and an emitter electrode contacting the emitter region.

It is desirable that the emitter mesa is formed by dry etching, or formed by dry etching and subsequent wet etching.

According to the transistor of the first aspect, sizes of the base regions and collector regions are defined small by the high-resistance regions formed by ion implantation, whereby there is provided a heterojunction bipolar transistor having a excellent flatness and uniformity in a plane. The emitter region is formed in mesa shape by dry etching, such as RIE or RIBE method, or by dry etching and subsequent wet etching. Since the mesa shape is mainly defined by the dry etching, it is apt to have an excellent dimensional accuracy due to less side etching as compared to employing wet etching only. The subsequent wet etching can remove damages which have been given by the dry etching.

Since no ion implanted region contact the junction between the emitter and base regions, base impurities are prevented from being diffused into the emitter region. Since many crystal defects are formed around an ion implanted region, base impurities are abnormally diffused into an emitter region where a emitter-base junction contact the ion implanted region as in the conventional structure (see reference symbol 29 in FIGS. 1A and 1B). This has been confirmed by the present inventors. In contrast, the emitter-base junction of the present invention does not contact any ion implanted region, and no abnormal diffusion of base impurities occurs. Therefore, on-voltage changes due to the abnormal diffusion can be prevented.

Further, ion implantation can be used to form a high-resistance region for separating adjacent transistors from each other as well as defining device size. This can contribute to flatness and uniformity in a plane of the resultant device.

According to a second aspect of the present invention, there is provided a heterojunction bipolar transistor comprising:
- a semiconductor support layer;
- an emitter region of a first conductivity type, formed of a low-resistance part of a first semiconductor film formed on the support layer;
- a first high-resistance region, formed of a high-resistance part of the first semiconductor film surrounding and defining the emitter region, the first high-resistance region containing ion-implanted impurities for attaining a high-resistance;
- an emitter electrode contacting the emitter region;
- a base region of a second conductivity type, formed of a low-resistance part of a second semiconductor film formed on the emitter region, the base region forming a heterojunction along with the emitter region, and located substantially within plan view area of the emitter region defined by the first high-resistance region;
- a second high-resistance region, formed of a high-resistance part of the second semiconductor film surrounding and defining the base region, the second high-resistance region containing ion-implanted impurities for attaining a high-resistance;
- a base electrode contacting the base region;
- a collector region of the first conductivity type, formed of a third semiconductor film formed on the base region, the collector region is formed as collector mesa on the base region by dry etching and also located substantially within plan view area of the emitter and base regions defined by the first and second high-resistance regions, respectively;
- an insulating film surrounding and defining the collector region, the insulating film being formed independently of the third semiconductor film; and
- a collector electrode contacting the collector region.

According to a transistor of the second aspect, advantages similar to those of a transistor of the first aspect can be attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 2:
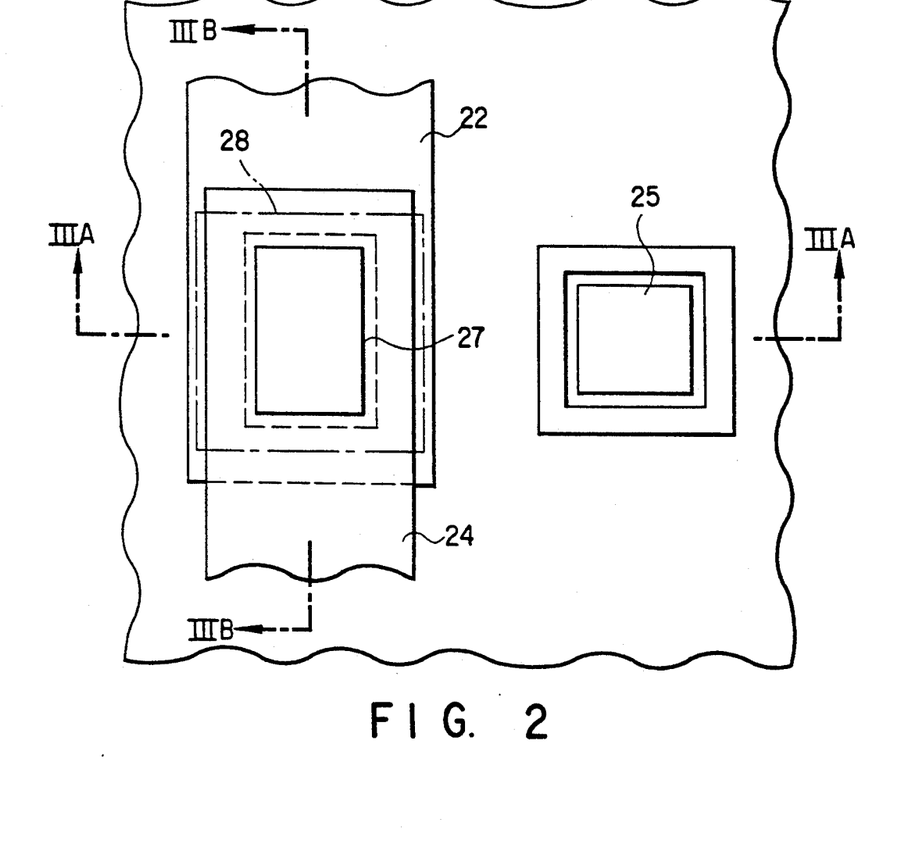
FIG. 2 is a plan view showing a heterojunction bipolar transistor according to a first embodiment of the present invention.

In FIG. 2 showing an outline of the structure of a heterojunction bipolar transistor which is a first embodiment of the present invention, line IIIA—IIIA indicates a direction at right angle to the direction of leading emitter electrode, and line IIIB—IIIB indicates the direction of leading the emitter electrode.

Figure 3A:
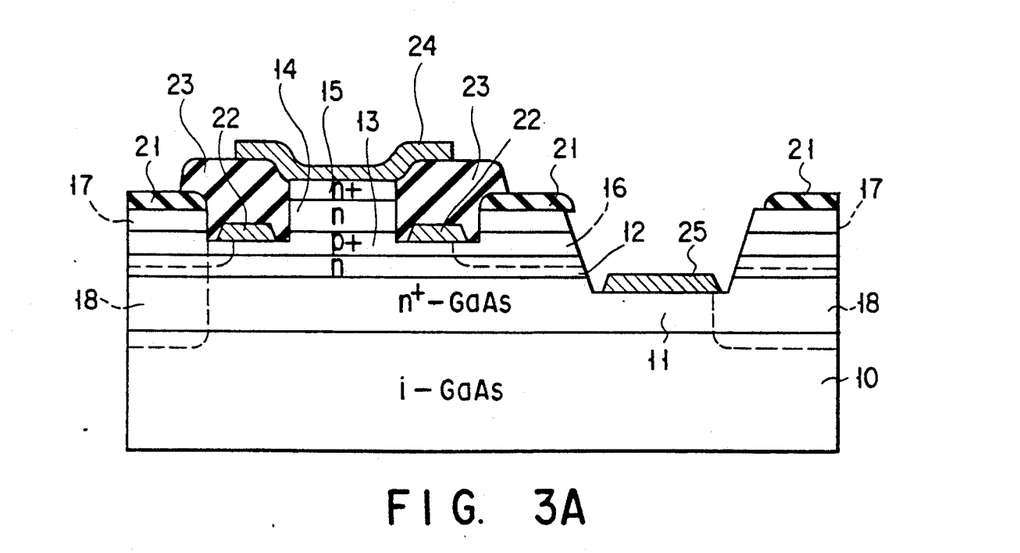
FIGS. 3A and 3B are cross sectional views along lines IIIA—IIIA and IIIB—IIIB in FIG. 2, respectively.
Figure 3B:
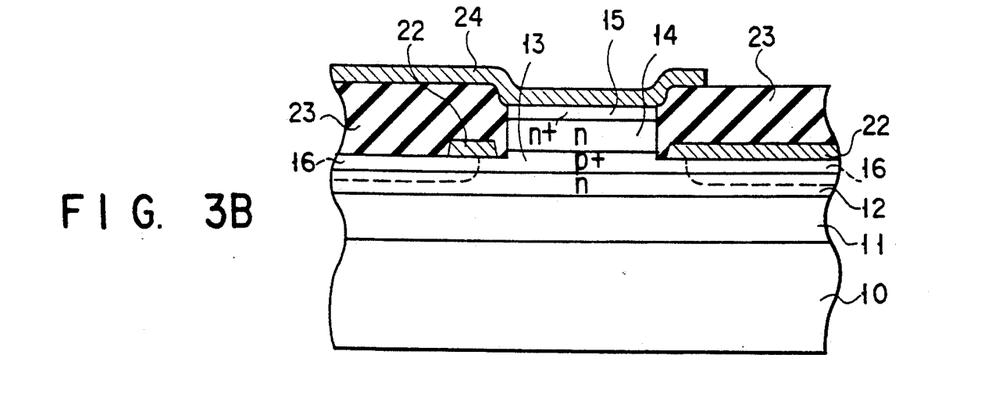

In FIGS. 3A and 3B, reference symbol 10 denotes i-type (intrinsic semiconductor, semiinsulative) GaAS substrate. On the substrate 10, an n+-type GaAS collector contact layer 11 (Si concentration, $5 \times 10^{18}$ cm$^{-3}$; thickness, 500 nm), an n-type GaAs collector layer 12 (Si concentration, $5 \times 10^{16}$ cm$^{-3}$; thickness, 400 nm), a p+-type GaAs base layer 13 (Be concentration, $5 \times 10^{19}$ cm$^{-3}$; thickness, 100 nm), an n-type AlGaAs emitter layer 14 (Al molar density, 0.3; Si concentration, $1 \times 10^{18}$ cm$^{-3}$; thickness, 300 nm), an n+-type InGaAs emitter contact layer 15 (In molar density, 0.5; Si concentration, $2 \times 10^{19}$ cm$^{-3}$; thickness, 500 nm) are formed in the order mentioned.

Although not shown in FIGS. 3A and 3B, an undoped GaAs layer having a thickness of 10 nm is interposed between the GaAs base layer 13 and the AlGaAs emitter layer 14. Also, grading layers having an Al molar density of 0 to 0.3 and a thickness of 30 nm are arranged one on either side of the AlGaAs emitter layer 14. Furthermore, an n-type GaAs layer having an Si concentration of $5 \times 10^{18}$ cm$^{-3}$, a film thickness, of 50 nm is arranged on the top surface of AlGaAs emitter layer 14.

The emitter layer 14 and the emitter contact layer 15 are mesa-shaped. Regions 16 and 17 made highly resistant by B+ ion implantation into the collector layer 12 from the exposed base layer 13 are formed around the mesa-shaped layers 14 and 15. A region 18 rendered highly resistant by H+ ion implantation is formed to function as an element-isolation. H+ ions are implanted in part of the high-resistance region 17. An ion implanted region interface 28 of the resistance regions 16 and 17 is located outside the side walls of an emitter mesa 27.

On the base layer 13 exposed at the side of the emitter mesa 27, a base electrode 22 is formed and led in one direction. On the emitter contact layer 15, an emitter electrode 24 is formed and led in another direction opposite to that of the base electrode 22. A recess is formed by etching, reaching the collector contact layer 11 and located apart from the emitter mesa. On the collector contact layer 11 exposed by the etching, a collector electrode 25 is formed. Reference symbols 21 and 23 in FIGS. 3A and 3B designate insulating layers.

A method of manufacturing the transistor according to the first embodiment will be described, with reference to FIGS. 4A to 4F.

Figure 4A:
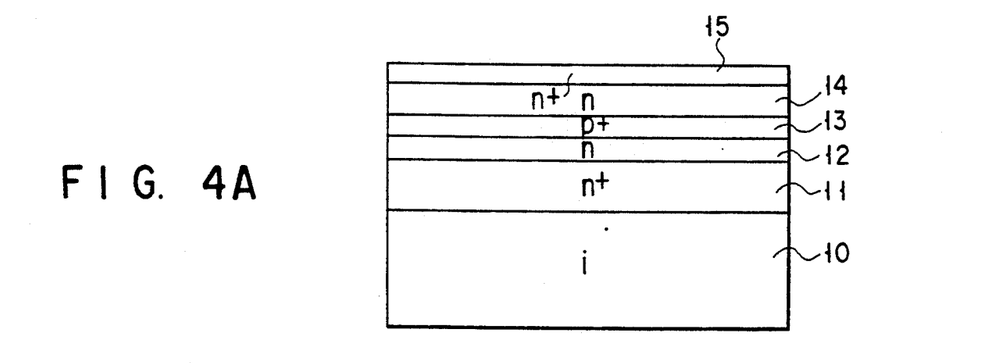
FIGS. 4A to 4F are cross sectional views showing a process for manufacturing the transistor shown in FIGS. 2, 3A, and 3B.

First, as shown in FIG. 4A, the n+-type GaAs collector contact layer 11, the n-type GaAs collector layer 12, the p+-type GaAs base layer 13, the n-type AlGaAs emitter layer 14, and the n+-type InGaAs emitter contact layer 15 are formed by molecular beam epitaxy (MBE) method on the i-type GaAs substrate 10, in the order mentioned.

Figure 4B:
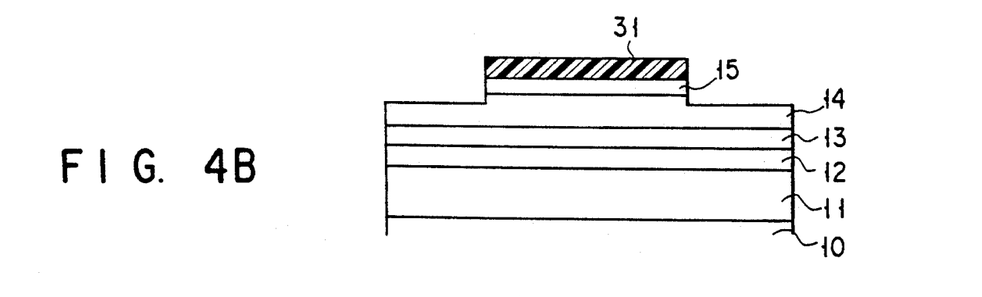

Then, as shown in FIG. 4B, a resist mask 31 is formed on the emitter contact layer 15, and part of the layer is etched to a depth reaching to the emitter layer 14, by means of ordinary photo engraving process (PEP).

Figure 4C:
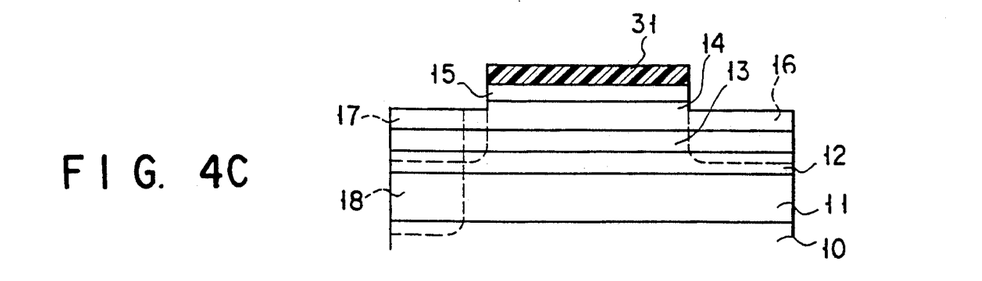

Next, as shown in FIG. 4C, the high-resistance regions 16 and 17 are formed by B-ion implantation under an acceleration voltage of 140 keV and at dose of $4 \times 10^{13}$ cm$^{-2}$, by using the resist mask 31 and an SiO$_2$ film (not shown) as protection masks. The high-resistance region 18 is formed by H+ ion implantation under an acceleration voltage of 190 keV and at a dose of $1.5 \times 10^{15}$ cm$^{-2}$. Here, the area of the base region is defined by the high-resistance regions 16 and 17, and the collector region, i.e., an element area, is defined by the high-resistance region 18.

Figure 4D:
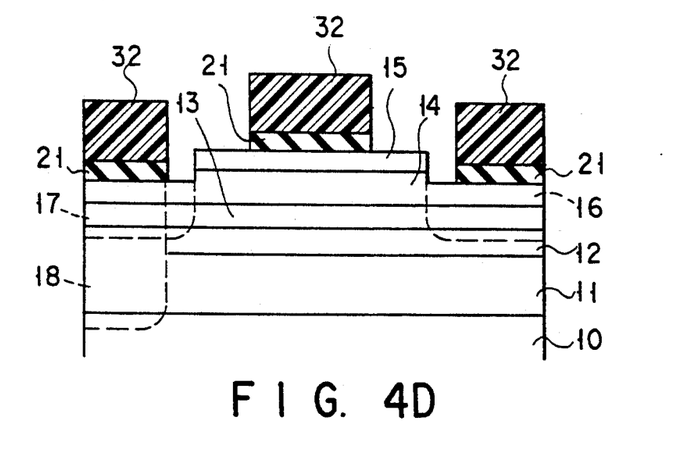

As shown in FIG. 4D, an SiO$_2$ film 21 is deposited on the entire surface of the resultant structure by CVD method. Then, a resist mask 32 is formed. Part of the resist mask 32 and the SiO$_2$ film 21 are removed by ordinary PEP and reactive ion etching (RIE) method using oxygen gas and CF gas, whereby an opening for a base electrode is formed.

Figure 4E:
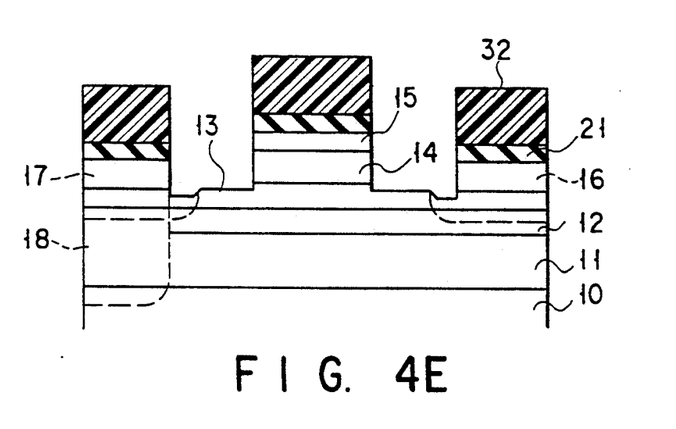

As shown in FIG. 4E, an emitter mesa is formed by dry etching the emitter layer 14 to a depth reaching to the base layer 13 under Cl$_2$ gas pressure of $5 \times 10^{-4}$ Torr by electron cyclotron resonance - reactive ion beam etching (ECR - RIBE) method using Cl$_2$ gas applied into the opening. Subsequently, wet etching is performed, using a phosphoric acid etchant (phosphoric acid:H$_2$O$_2$:H$_2$ = 1:1:30). This wet etching removes crystal defects and residues resulting from the dry etching, making it easy to perform lift-off process for the base electrode described bellow.

Figure 4F:
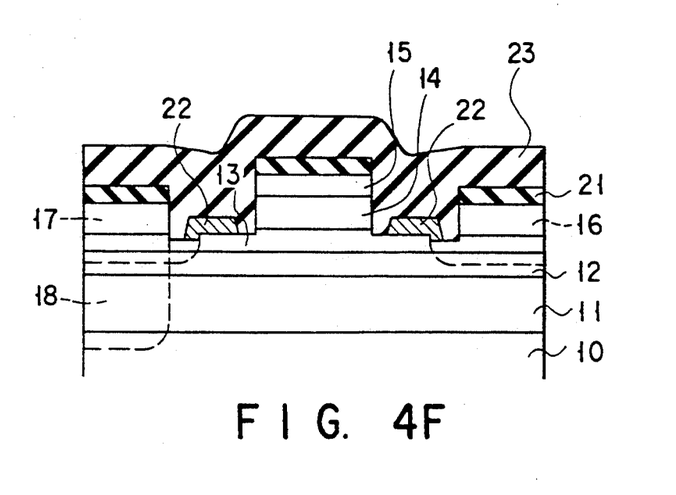

Then, as shown in FIG. 4F, base electrode metal (Cr/Au) is vapor-deposited on the entire surface of the resultant structure, and the base electrode 22 is formed by lift-off method. Thereafter, a polyimid resin film 23 is formed on the entire surface of the resultant structure, and then is cured.

Photoresist (not shown) is applied, making the surface of the structure flat. The SiO$_2$ film 21 is exposed by RIE method using oxygen gas. The base electrode 22 is protected with the polyimid resin film 23, after eliminating unnecessary portion of the polyimid resin film 23. The emitter electrode (Ti/Au) 24 is formed by reverse taper PEP using monochlorobenzene. In this case, the SiO$_2$ film 21 on the emitter contact layer 14 is removed by ammonium fluoride solution. The collector electrode (AuGe/Ni/Ti/Au) 25 is formed by ordinary PEP. This produces the heterojunction bipolar transistor shown in FIGS. 2, 3A, and 3B.

Figure 5A:
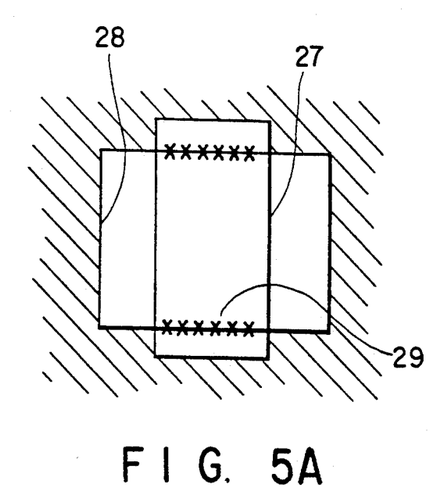
FIGS. 5A and 5B are schematic plan views respectively showing the conventional transistor shown in FIGS. 1A and 1B, and the transistor shown in FIGS. 2, 3A, and 3B.

Great differences between the conventional transistor and the transistor of the first embodiment will be described with reference to FIGS. 5A and 5B. In the conventional transistor, side walls of the mesa 27 and the B+ ion implanted region interface 28 are crossing in the direction of leading the emitter electrode, as shown in FIG. 5A. The base-emitter junction and the ion implanted region contact each other in part (x-marked area 29). Therefore, at the time of ion implantation, base impurities are abnormally diffused into the emitter region, causing changes in on-voltage.

Figure 5B:
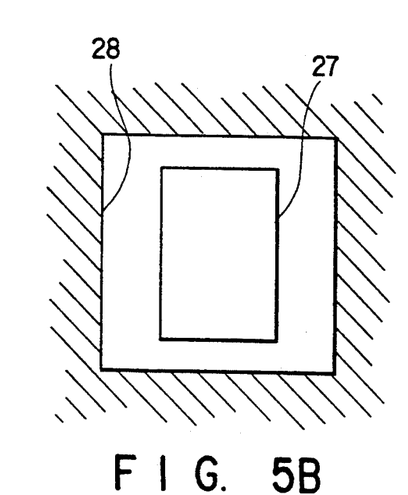

On the other hands, in the transistor of the first embodiment shown in FIG. 5B, the B+ ion implanted region interface 28 is located outside the side walls of the mesa, and the base-emitter junction does not contact the ion implanted region. Therefore, the base impurities are not diffused abnormally into the emitter region at the time of ion implantation, and the on-voltage remains unchanged.

In the conventional transistor, the emitter size is defined by ion implantation, while in the transistor of the first embodiment, the emitter size is defined only by mesa etching. Therefore, the conventional transistor can have a smaller emitter. However, the experiments conducted by the present inventors have shown, when the emitter size is defined by ion implantation, resistance at the periphery inside the emitter region increases due to the impurity ions diffused into the emitter region. This does not matter if the emitter is comparatively large, but if emitter is small, the increase of resistance will impose a problem, and the emitter size which can be defined by ion implantation will be limited.

On the other hand, the smallest emitter size which dry etching can define is larger than the smallest emitter size which ion implantation can define. But, the substantial smallest emitter size in a range where the resistance increase in the emitter region makes no problem, and which can be defined by ion implantation, can also be defined by dry etching such as RIE etc. In other words, ion implantation can define a emitter size smaller, but in consideration of the problem of emitter-resistance increase, the smallest emitter size which ion implantation can defined actually can be fully obtained by dry etching as well.

Figure 6:
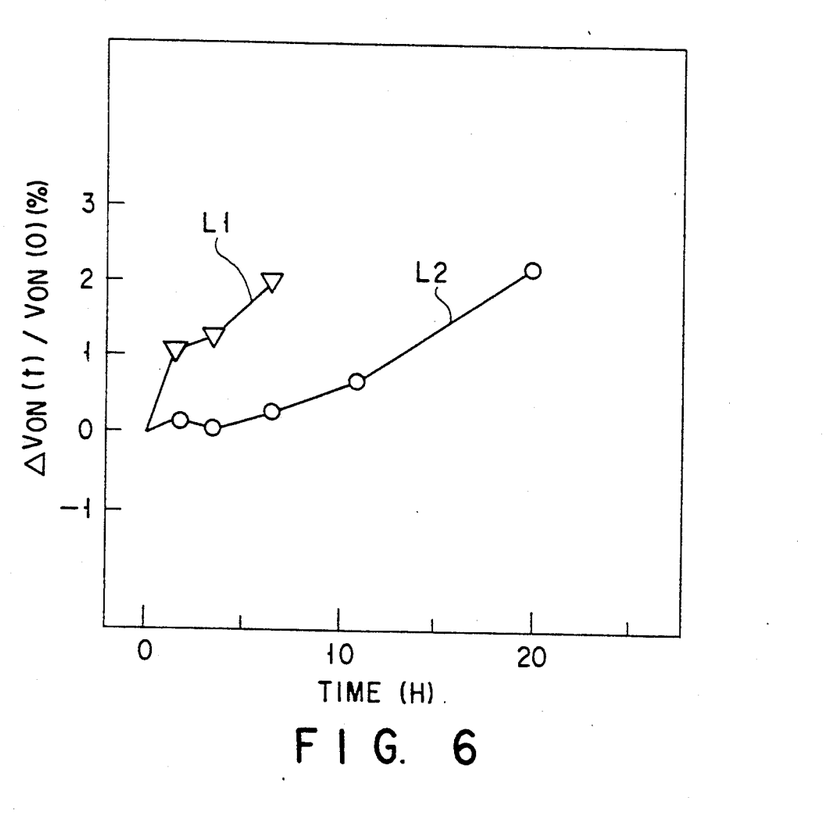
FIG. 6 is a graph showing how on-voltage changes with time in the conventional transistor shown in FIGS. 1A and 1B, and the transistor shown in FIGS. 2, 3A, and 3B.

FIG. 6 shows a graph representing the advantages of the first embodiment of the present invention, and also illustrating how the on-voltage changes with time in the conventional transistor shown in FIGS. 1A and 1B, and in the transistor of the first embodiment shown in FIGS. 2, 3A, and 3B. In FIG. 6, line L1 shows the characteristic of the conventional transistor and line L2 that of the transistor of the first embodiment.

In the experiments, samples of the conventional transistor and of the transistor of the first embodiment were formed on the same substrate. The samples were put to high-temperature conducting test, and changes in the on-voltage were measured at ambient temperature of 200° C., a collector current density of $1 \times 10^5$ A/cm$^2$, and a collector-emitter voltage of 3 V. On-voltage is defined by voltage between the base and the emitter which sets the collector current at 300 A/cm$^2$, as they were measure at room temperature. The difference $\Delta$Von(t) between the on-voltage Von(0) immediately after forming the samples and the on-voltage Von(t) after t hours is Von(t) - Von(0). The ratio of $\Delta$Von(t) to Von(0) is presented in percentage (%) and plotted on the ordinate of FIG. 6. Time is plotted on the abscissa of FIG. 6. As is evident from FIG. 6, in the conventional transistor, the increase of the on-voltage reached 2% after 7 hours. In the transistors of the first embodiment, the increase of the on-voltage remained below 2% until 20 hours. Hence, the first embodiment can provide a transistor in which the on-voltage changes very little.

In the transistor of the first embodiment, the emitter mesa is formed by dry etching, and the high-resistance regions are formed by ion implantation outside the emitter mesa. Device size can be defined by the high-resistance regions and the emitter size can be defined smaller by the mesa structure. Since the ion implanted region does not contact the base-emitter junction, the base impurities are not diffused abnormally into the emitter region, and on-voltage changes can be prevented. Also, since dry etching is effected for forming the emitter mesa, the interconnections led from the electrodes are not cut by a low pattern precision or reverse taper of the emitter mesa, both of which may be caused by wet etching. This helps improve the reliability of the transistor. Therefore, there if realized a heterojunction bipolar transistor having a less on-voltage changes and high reliability.

Figure 7A:
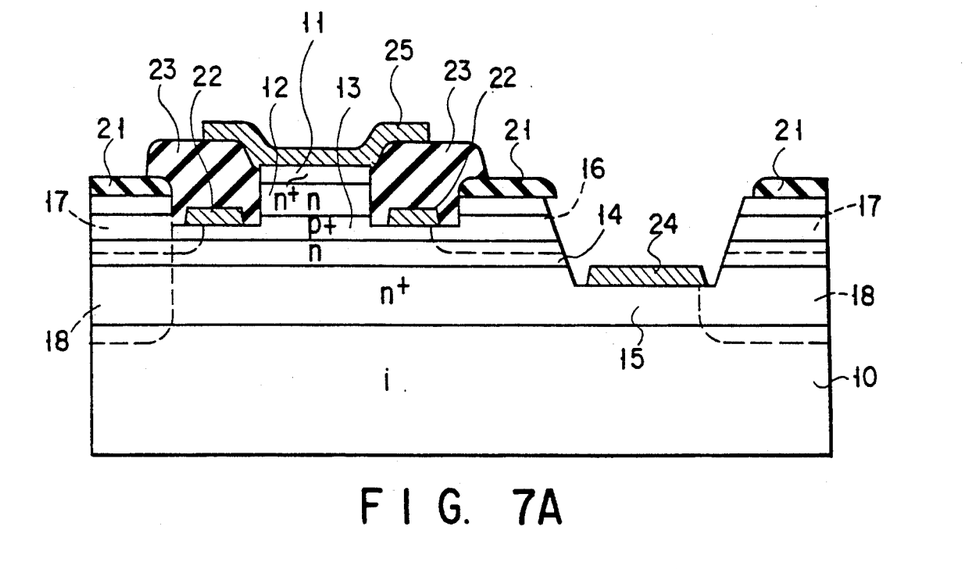
FIGS. 7A and 7B are cross sectional views showing a second embodiment of the present invention, and corresponding to FIGS. 3A and 3B, respectively.
Figure 7B:
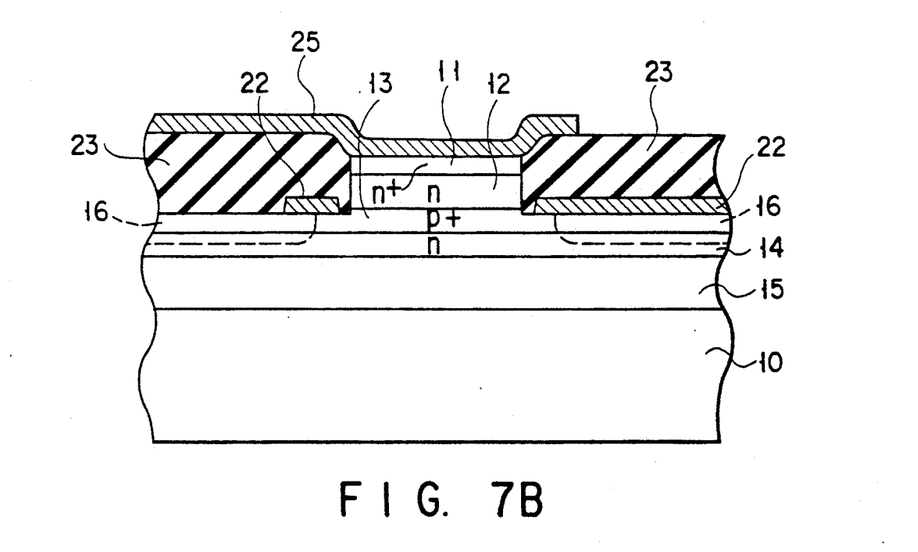

The first embodiment described above is a heterojunction bipolar transistor of a so-called emitter top type which has its emitter on the upper surface. Nonetheless, the present invention can be applied to a heterojunction bipolar transistor of a so-called collector top type which has its collector on the upper surface. FIGS. 7A and 7B show a second embodiment of the present invention, which is a heterojunction bipolar transistor of the collector top type. FIGS. 7A and 7B are cross sectional views corresponding to FIGS. 3A and 3B, respectively. The parts corresponding to those shown in FIGS. 3A and 3B are denoted with the same reference symbols in FIGS. 7A and 7B. This heterojunction bipolar transistor of the collector top type has a very stable base-collector junction and a high reliability.

The embodiments described above are transistors of the npn type. Needless to say, the present invention can be applied to a transistor of the pnp type.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A heterojunction bipolar transistor comprising:
a semiconductor support layer;
a collector region of a first conductivity type, formed of a low-resistance part of a first semiconductor film formed on said support layer;
a first high-resistance region, formed of a high-resistance part of said first semiconductor film surrounding and defining said collector region, said first high-resistance region containing ion-implanted impurities for attaining a high-resistance;
a collector electrode contacting said collector region;
a base region of a second conductivity type, formed of a low-resistance part of a second semiconductor film formed on said collector region, and located substantially within plan view area of the collector region defined by said first high-resistance region;
a second high-resistance region, formed of a high-resistance part of said second semiconductor film surrounding and defining said base region, said second high-resistance region containing ion-implanted impurities for attaining a high-resistance;
a base electrode contacting said base region;
an emitter region of the first conductivity type, formed of a third semiconductor film formed on said base region, said emitter region forming a heterojunction along with said base region, said emitter region being formed as an emitter mesa on the base region by dry etching and also located substantially within plan view area of the collector and base regions defined by said first and second high-resistance regions, respectively, such that said first and second high-resistance regions do not contact any junction between said emitter region and said base region;
an insulating film surrounding and defining said emitter region, said insulating film being formed independently of said third semiconductor film; and
an emitter electrode contacting said emitter region.

2. The transistor according to claim 1, wherein said third semiconductor film comprises an emitter layer and an emitter contact layer formed on said emitter layer, and said emitter electrode is formed on said emitter contact layer.

3. The transistor according to claim 1, wherein said first semiconductor film comprises a collector contact layer and a collector layer formed on said collector contact layer, and said collector electrode is formed on said collector contact layer.

4. The transistor according to claim 1, wherein said support layer has a high-resistance region formed at the same time as said first high-resistance region and connected thereto.

5. The transistor according to claim 1, wherein said second semiconductor film has a high-resistance region formed at the same time as said second high-resistance region and connected thereto.

6. The transistor according to claim 1, wherein said support layer is constituted by a semiinsulative semiconductor substrate.

7. The transistor according to claim 1, wherein said base region is made of GaAs, and said emitter region is made of AlGaAs.

8. A heterojunction bipolar transistor comprising:
a semiconductor support layer;
an emitter region of a first conductivity type, formed of a low-resistance part of said a first semiconductor film formed on said support layer;
a first high-resistance region, formed of a high-resistance part of said first semiconductor film surrounding and defining said emitter region, said first high-resistance region containing ion-implanted impurities for attaining a high-resistance;

an emitter electrode contacting said emitter region;

a base region of a second conductivity type, formed of a low-resistance part of a second semiconductor film formed on said emitter region, said base region forming a heterojunction along with said emitter region, and located substantially within a plan view area of the emitter region defined by said first high-resistance region;

a second high-resistance region, formed of a high-resistance part of said second semiconductor film surrounding and defining said base region, said second high-resistance region containing ion-implanted impurities for attaining a high-resistance;

a base electrode contacting said base region;

a collector region of the first conductivity type, formed of a third semiconductor film formed on said base region, said collector region being formed as collector mesa on the base region by dry etching and also located substantially within plan view area of the emitter and base regions defined by said first and second high-resistance regions, respectively, such that said first and second high resistance regions do not contact with any junction between said collector region and said base region;

an insulating film surrounding and defining said collector region, said insulating film being formed independently of said third semiconductor film; and a collector electrode contacting said collector region.

9. The transistor according to claim 8, wherein said third semiconductor film comprises an collector layer and an collector contact layer formed on said collector layer, and said collector electrode is formed on said collector contact layer.

10. The transistor according to claim 8, wherein said first semiconductor film comprises a emitter contact layer and a emitter layer formed on said emitter contact layer, and said emitter electrode is formed on said emitter contact layer.

11. The transistor according to claim 8, wherein said support layer has a high-resistance region formed at the same time as said first high-resistance region and connected thereto.

12. The transistor according to claim 8, wherein said second semiconductor film has a high-resistance region formed at the same time as said second high-resistance region and connected thereto.

13. The transistor according to claim 8, wherein said support layer is constituted by a semiinsulative semiconductor substrate.

14. The transistor according to claim 8, wherein said base region is made of GaAs, and said emitter region is made of AlGaAs.

15. A heterojunction bipolar transistor comprising:

a semiconductor support layer;

a collector region of a first conductivity type, formed of a low-resistance part of a first semiconductor film formed on said support layer;

a first high-resistance region, formed of a high-resistance part of said first semiconductor film surrounding and defining said collector region, said first high-resistance region containing ion-implanted impurities for attaining a high-resistance;

a collector electrode contacting said collector region;

a base region of a second conductivity type, formed of a low-resistance part of a second semiconductor film formed on said collector region, and located substantially within plan view area of the collector region defined by said first high-resistance region;

a second high-resistance region, formed of a high-resistance part of said second semiconductor film surrounding and defining said base region, said second high-resistance region containing ion-implanted impurities for attaining a high-resistance;

a base electrode contacting said base region;

an emitter region of the first conductivity type, formed of a third semiconductor film formed on said base region, said emitter region forming a heterojunction along with said base region, said emitter region being formed as an emitter mesa on the base region by dry etching and also located substantially within plan view area of the collector and base regions defined by said first and second high-resistance regions, respectively;

an insulating film surrounding and defining said emitter region, said insulating film being formed independently of said third semiconductor film; and an emitter electrode contacting said emitter region;

wherein said emitter mesa is formed by dry etching said third semiconductor film after said second and first high-resistance regions are formed, such that said second and first high-resistance regions do not contact any junction between said emitter region and said base region.

16. A heterojunction bipolar transistor comprising:

a semiconductor support layer;

an emitter region of a first conductivity type, formed of a low-resistance part of a first semiconductor film formed on said support layer;

a first high-resistance region, formed of a high-resistance part of said first semiconductor film surrounding and defining said emitter region, said first high-resistance region containing ion-implanted impurities for attaining a high-resistance;

an emitter electrode contacting said emitter region;

a base region of a second conductivity type, formed of a low-resistance part of a second semiconductor film formed on said emitter region, said base region forming a heterojunction along with said emitter region, and located substantially within plan view area of the emitter region defined by said first high-resistance region;

a second high-resistance region, formed of a high-resistance part of said second semiconductor film surrounding and defining said base region, said second high-resistance region containing ion-implanted impurities for attaining a high-resistance;

a base electrode contacting said base region;

a collector region of the first conductivity type, formed of a third semiconductor film formed on said base region, said collector region being formed as a collector mesa on the base region by dry etching and also located substantially within plan view area of the emitter and base regions defined by said first and second high-resistance regions, respectively;

an insulating film surrounding and defining said collector region, said insulating film being formed independently of said third semiconductor film; and a collector electrode contacting said collector region;

wherein said collector mesa is formed by dry etching said third semiconductor film after said second and first high-resistance regions are formed, such that said second and first high-resistance regions do not contact any junction between said collector region and said base region.

* * * * *